(12) United States Patent
Ohtani et al.

(10) Patent No.: US 6,830,617 B1
(45) Date of Patent: Dec. 14, 2004

(54) METHOD FOR MANUFACTURING SEMICONDUCTOR DEVICE

(75) Inventors: Hisashi Ohtani, Kanagawa (JP);
Akiharu Miyanaga, Kanagawa (JP);
Satoshi Teramoto, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/690,747

(22) Filed: Aug. 1, 1996

(30) Foreign Application Priority Data

Aug. 2, 1995 (JP) ............................................. 7-216608

(51) Int. Cl.$^7$ ............................................. C30B 25/02
(52) U.S. Cl. .......................... 117/103; 117/95; 117/97; 117/923; 117/939
(58) Field of Search ................................ 117/103, 939, 117/923, 95, 97

(56) References Cited

U.S. PATENT DOCUMENTS

| | | | |
|---|---|---|---|
| 3,535,775 A | * 10/1970 | Garfinkel ...................... 117/95 |
| 4,371,403 A | 2/1983 | Ikubo et al. |
| 4,477,308 A | * 10/1984 | Gibson ........................ 156/603 |
| 4,534,820 A | * 8/1985 | Mori ........................... 117/939 |
| 5,244,819 A | 9/1993 | Yue |
| 5,275,896 A | * 1/1994 | Garofalo ........................ 430/5 |
| 5,403,772 A | 4/1995 | Zhang et al. ................ 437/101 |
| 5,426,064 A | 6/1995 | Zhang et al. .................. 437/40 |
| 5,481,121 A | 1/1996 | Zhang et al. .................. 257/64 |
| 5,488,000 A | 1/1996 | Zhang et al. .................. 437/21 |
| 5,492,843 A | 2/1996 | Adachi et al. ................. 437/21 |
| 5,501,989 A | 3/1996 | Takayama et al. ............ 437/21 |
| 5,508,533 A | 4/1996 | Takemura ..................... 257/64 |
| 5,529,937 A | 6/1996 | Zhang et al. .................. 437/10 |
| 5,534,716 A | 7/1996 | Takemura ..................... 257/72 |
| 5,543,352 A | 8/1996 | Ohtani et al. ................ 437/101 |
| 5,563,426 A | 10/1996 | Zhang et al. .................. 257/66 |
| 5,569,610 A | 10/1996 | Zhang et al. .................. 437/21 |
| 5,569,936 A | 10/1996 | Zhang et al. .................. 257/66 |
| 5,580,792 A | 12/1996 | Zhang et al. .................. 437/10 |
| 5,585,291 A | 12/1996 | Ohtani et al. ................. 437/40 |

(List continued on next page.)

FOREIGN PATENT DOCUMENTS

JP 5-109737 4/1993

OTHER PUBLICATIONS

A. Ourmazd, "Gettering of Impurities in Silicon," Materials Research Society, vol. 59, 1986, pp.331–340.
A. Ourmazd, et al., "Gettering of Metallic Impurities in Silicon," Materials Research Society, vol. 36, 1985, pp. 25–30.
Etienne G. Colas, et al., "Quantitative Study of Metal Gettering in Silicon," Materials Research Society, vol. 59, 1986, pp. 341–346.
K. Graff et al., "Palladium Test: A Tool to Evaluate Gettering Efficiency," Materials Research Society, vol. 36, 1985, pp. 19–24.

*Primary Examiner*—Robert Kunemund
(74) *Attorney, Agent, or Firm*—Fish & Richardson P.C.

(57) ABSTRACT

In a method for manufacturing a crystalline silicon film by utilizing a metal element that promotes the crystallization of silicon, an influence of this metal element can be suppressed.

A nickel element 104 is retained in contact with a surface of an amorphous silicon film 103 patterned to form a predetermined pattern in such a manner that the metal element is brought into contact with the amorphous silicon film 103 patterned to form a predetermined pattern. Next, the crystalline silicon film 105 is formed by a heat treatment. At this time, the nickel element is segregated in the edge region of the pattern. Further, a crystalline silicon film 100 having no region to which the metal element concentrated by patterning using a mask 107. By using this crystalline silicon film 100 as an active layer, the thin film transistor is fabricated.

71 Claims, 10 Drawing Sheets

U.S. PATENT DOCUMENTS

| | | | |
|---|---|---|---|
| 5,589,694 A | 12/1996 | Takayama et al. | 257/67 |
| 5,595,923 A | 1/1997 | Zhang et al. | 437/41 |
| 5,595,944 A | 1/1997 | Zhang et al. | 437/41 |
| 5,604,360 A | 2/1997 | Zhang et al. | 257/72 |
| 5,605,846 A | 2/1997 | Ohtani et al. | 437/21 |
| 5,606,179 A | 2/1997 | Yamazaki et al. | 257/59 |
| 5,608,232 A | 3/1997 | Yamazaki et al. | 257/66 |
| 5,612,250 A | 3/1997 | Ohtani et al. | 437/101 |
| 5,614,426 A | 3/1997 | Funada et al. | 437/40 |
| 5,614,733 A | 3/1997 | Zhang et al. | 257/66 |
| 5,616,506 A | 4/1997 | Takemura | 438/150 |
| 5,620,910 A | 4/1997 | Teramoto | 438/151 |
| 5,621,224 A | 4/1997 | Yamazaki et al. | 257/66 |
| 5,624,851 A | 4/1997 | Takayama et al. | 438/166 |
| 5,637,515 A | 6/1997 | Takemura | 438/162 |
| 5,639,698 A | 6/1997 | Yamazaki et al. | 437/228 |
| 5,643,826 A | 7/1997 | Ohtani et al. | 437/88 |
| 5,646,424 A | 7/1997 | Zhang et al. | 257/66 |
| 5,654,203 A | 8/1997 | Ohtani et al. | 438/97 |
| 5,656,825 A | 8/1997 | Kusumoto et al. | 257/66 |
| 5,663,077 A | 9/1997 | Adachi et al. | 438/151 |
| 5,677,549 A | 10/1997 | Takayama et al. | 257/66 |
| 5,696,386 A | 12/1997 | Yamazaki | 257/57 |
| 5,696,388 A | 12/1997 | Funada et al. | 257/64 |
| 5,700,333 A | 12/1997 | Yamazaki et al. | |
| 5,705,829 A | 1/1998 | Miyanaga et al. | 257/66 |
| 5,712,191 A * | 1/1998 | Nakajima | 117/8 |
| 5,712,203 A * | 1/1998 | Hsu | 438/275 |
| 5,744,824 A | 4/1998 | Kousai et al. | 257/74 |
| 5,843,225 A | 12/1998 | Takayama et al. | |
| 5,915,174 A | 6/1999 | Yamazaki et al. | |
| 5,956,579 A | 9/1999 | Yamazaki et al. | |
| 5,961,743 A | 10/1999 | Yamazaki et al. | |
| 5,977,559 A | 11/1999 | Zhang et al. | |
| 6,066,518 A | 5/2000 | Yamazaki | |
| 6,072,193 A | 6/2000 | Ohnuma et al. | |

\* cited by examiner

| 550°CSPC | 600°CSPC | 640°CSPC |
|---|---|---|
|  |  |  |
|  |  |  |
|  |  |  |

METHOD FOR MANUFACTURING SEMICONDUCTOR DEVICE

DETAILED DESCRIPTION OF THE INVENTION

1. Field of Industrial Use

The present invention disclosed in this specification relates to a method for manufacturing a crystalline silicon thin film, further relates to a method for manufacturing a semiconductor device using this crystalline silicon thin film.

2. Prior Art

Conventionally, the following technique is known. That is, an amorphous silicon film formed on a glass substrate, or a quartz substrate is crystallized to fabricate a crystalline silicon film, and a thin film transistor is formed by using this crystalline silicon film.

As for methods for forming this crystalline silicon film, they are classified into the following methods substantially. That is, laser light is irradiated to an amorphous silicon film formed by a plasma CVD method and the like to convert this amorphous silicon film into a crystalline silicon film, and a heat treatment is carried out to an amorphous silicon film formed by a plasma CVD method and the like, so that this amorphous silicon film is converted into a crystalline silicon film.

As a method for forming such a crystalline silicon film, a technique disclosed in Japanese Laid-open Patent Application No. 06-232059 is known. This technique is used to crystallize the amorphous silicon film at a lower temperature by using the metal elements that promote the crystallization of silicon.

PROBLEMS TO BE SOLVED BY THE INVENTION

According to the research made by present applicant, when a metal element that promotes the crystallization of silicon is used to obtain the crystalline silicon film, and further the thin-film transistor is manufactured by using this crystalline silicon film, the characteristic of this thin-film transistors tends to differ.

An object of the invention disclosed in this specification is, for the technique to form a crystalline silicon film by using a metal element that promotes the crystallization of silicon, to provide a technique which prevents the metal element from locally concentrating in this crystalline silicon film.

MEANS TO SOLVE THESE PROBLEMS

As a result of extensive study to solve the above problem that the concentration of metal element occurs in the crystalline silicon film, the below-mentioned matters were recognized.

FIG. 2 represents an observation result of a lump of a nickel element in a crystalline silicon film of 1 $\mu$m square, which is crystallized by using the nickel element.

A description will now be made of a method for manufacturing the crystalline silicon film from which the data indicated in FIG. 2 could be obtained. First, an amorphous silicon film having a thickness of 500 Å is formed on a glass substrate by a plasma CVD method. Then, a nickel acetate solution is coated on the surface of the amorphous silicon film. Under this state, it is realized that the nickel element is in contact with the surface of the amorphous silicon film.

Then, the heat treatment is carried out for 4 hours at a heating temperature (indicated as SPC temperature in the figure) described in FIG. 2. As a result, a crystalline silicon film formed on a glass substrate can be obtained.

The differences between the samples to obtain three sorts of data shown in FIG. 2 are the heating temperatures to obtain the crystalline silicon film.

The method for observing the lump of nickel element indicated in FIG. 2 is performed in accordance with the following manner. That is, the obtained crystalline silicon film is etched by FPM (mixture solution of hydrogen peroxide and fluorine compound) to remove the region where nickel is lumped (this region is nickel silicide). Then, the total number of the holes which the lump of nickel is removed is counted by using an electron microscope.

In FIG. 3, there are shown conditions of the holes which indicate the region where nickel is lumped. That is, FIG. 3 shows photographs taken by an electron microscope, showing the state after the surface of this crystalline silicon film has been etched by FPM.

Although this observation method could not measure the absolute value of the number of the lumps of nickel element, but evaluate the relative number.

As indicated in FIG. 2, the higher the temperature of the heating process is increased, the smaller the number of the detected lumps of nickel elements become. However, when the number of the lumps of nickel element is measured by SIMS (secondary ion mass spectroscopy), the concentrations of the nickel elements are substantially equal to each other, irrelevant to the differences in the temperatures at the heat treatment (during SPC). As a consequence, it is assumed that as to segregation of the nickel element, the higher the temperature at the heat treatment is increased, the larger each of these lumps becomes.

Also, it is found that the higher the temperature at the heating process is increased, the longer the diffusion distance of the nickel element becomes. This diffusion distance "D" may be expressed by approximately $D_0 t \exp(\Delta E/kT)$. In this formula, "$D_0$" indicates a properly selected constant, "t" denotes a heating time, "$\Delta E$" denotes a properly selected constant, "k" is a Boltzmann constant, "T" represents the heating temperature (SPC temperature). The trend expressed by this formula may be applied not only to the nickel element, but also to other metal elements.

As apparent from the above-described formula, when the heating temperature is increased, the diffusion distance of the nickel element is increased exponentially. On the other hand, the higher the heating temperature is increased, the larger the lumps of nickel element becomes.

Also, as a result of the research made by the Applicant, it could be recognized that the nickel element tends to concentrate into the region where the stress distortion is concentrated.

The present invention disclosed in this specification has been accomplished based upon the above mentioned matter. One aspect of the present invention disclosed in this specification is characterized by comprising the steps of:

forming an amorphous silicon film on a substrate having an insulating surface;

patterning said amorphous silicon film to form a predetermined pattern;

holding a metal element that promotes a crystallization of silicon in contact with said amorphous silicon film;

performing a heat treatment to crystallize said amorphous silicon film, thereby being converted into a crystalline silicon film; and etching a peripheral portion of the pattern of said crystalline silicon film.

Further, another aspect of the present invention is characterized by comprising the steps of:

forming a region into which a defect and/or stress is concentrated in a preselected region of an amorphous silicon film;

holding a metal element that promotes the crystallization of silicon in contact with said amorphous silicon film;

performing a heat treatment so as to crystallize said amorphous silicon film; and etching said preselected region.

The further aspect of the present invention is characterized by comprising the steps of:

forming a region into which a defect and/or stress is concentrated in a preselected region of an amorphous silicon film;

holding a metal element that promotes the crystallization of silicon in contact with said amorphous silicon film;

performing a heat treatment so as to crystallize said amorphous silicon film and, at the same time, segregating said metal element into said preselected region; and etching said preselected region.

In each of the above described invention, generally speaking, when a glass substrate is utilized, the temperature of the heat treatment is preferably selected to be 450 to 750° C.

When a quartz substrate is used as the substrate, the temperature of the heat treatment is preferably selected to be 800 to 1100° C. In particular, selecting such a high temperature is preferable to obtain the high crystallinity.

In accordance with the present invention disclosed in this specification, as for a metal element that promotes the crystallization of silicon, one or plural sorts of metal elements selected from Fe, Co, Ni, Ru, Rh, Pd, Os, Ir, Pt, Cu, and Au may be used.

As method for introducing this metal element, it is preferable to use a solution containing the metal element. Since this method using the solution can form the metal element in the film shape, there is a merit that this metal element can be held in such a manner that this metal element is uniformly brought into contact with the surface of the amorphous silicon.

Further, the present invention possesses such a particular feature that the concentration of the metal element can be easily controlled. The concentration of the metal element that promotes the crystallization of silicon should be reduced as low as possible in the silicon film. As a consequence, it is a very important technique to control an amount of a metal element to be introduced.

A description will now be made of the method using the metal element solution. First, when Ni is used as the metal element that promotes the crystallization of silicon, it is possible to use at least one sort of solution selected from such nickel compounds as nickel bromide, nickel acetate, nickel oxalate, nickel carbonate, nickel chloride, nickel iodide, nickel nitrate, nickel sulfate, nickel formate, nickel acetyl acetone, 4-cyclohexyl butyric nickel, nickel oxide, nickel hydroxide, and 2-ethylhexan e nickel.

Also, Ni contained in a non-polarity solution selected from at least one of benzene, toluene, xylene, carbon tetrachloride, chlorohorm, ether, trichloroethylene, and fleon may be used.

In the case that Fe (iron) is used as the metal element that promotes the crystallization of silicon, various materials known as iron salt may be selected from, for instance, iron (I) bromide ($FeBr_2 \cdot 6H_2O$), iron (II) bromide ($FeBr_3 6H_2O$), ferric acetate ($Fe(C_2H_3O_2)_{3x}H_2O$), ferrous chloride ($FeCl_2 4H_2O$), ferric chloride ($FeCl_3 \cdot 6H_2O$), ferric fluoride ($FeF_3 \cdot 3H_2O$), ferric nitrate ($Fe(NO_3)_3 9H_2O$), ferrous phosphate ($Fe_3(PO_4)_2 \cdot 8H_2O$), and ferric phosphate ($FePO_4 \cdot 2H_2O$).

In such a case that Co (cobalt) is used as the metal element that promotes the crystallization of silicon, various materials known as cobalt salt functioning as a cobalt compound may be selected from, for instance, cobalt bromide ($CoBr6H_2O$), cobalt acetate ($Co(C_2H_3O_2)_2 4H_2O$), cobalt chloride ($CoCl_2 6H_2O$), cobalt fluoride ($CoF_{2x}H_2O$), and cobalt nitrate ($Co(No_3)_2 6H_2O$).

When Ru (ruthenium) is used as the metal element that promotes the crystallization of silicon, various materials known as ruthenium salt functioning as a ruthenium compound, for example, ruthenium chloride ($RuCl_3 H_2O$) may be used.

When Rh (rhodium) is used as the metal element that promotes the crystallization of silicon, various materials known as rhodium salt functioning as a rhodium compound, for instance, rhodium chloride ($RhCI_3 3H_2O$) may be used.

When Pd (palladium) is used as the metal element that promotes the crystallization of silicon, various materials known as palladium salt functioning as a palladium compound, for instance, palladium chloride ($PdCl_2 2H_2O$) may be used.

When Os (osmium) is used as the metal element that promotes the crystallization of silicon, various materials known as osmium salt functioning as an osmium compound, for instance, osmium chloride ($OsCl_3$) may be used.

When Ir (iridium) is used as the metal element that promotes the crystallization of silicon, various materials known as iridium salt functioning as a iridium compound, the material selected from, for instance, iridium trichloride ($IrCl_3 3H_2O$) and iridium tetrachloride ($IrCl_4$), may be used.

When Pt (platinum) is used as the metal element that promotes the crystallization of silicon, various materials known as platinum salt functioning as a platinum compound, for instance, platinum (II) chloride ($PtCl_4 5H_2O$) may be used.

When Cu (copper) is used as the metal element that promotes the crystallization of silicon, various materials selected from a copper compound, that is, copper (II) acetate ($Cu(CH_3COO)_2$), copper (II) chloride ($CuCl_2 2H_2O$), and copper (II) nitrate ($Cu(NO_3)_2 3H_2O$) may be used.

When Au (gold) is used as the metal element that promotes the crystallization of silicon, various materials selected from a gold compound, that is, gold trichloride ($AuCl_{3x}H_2O$) and gold chloride salt ($AuHCl_4 4H_2O$) may be used.

Operation

As represented in FIG. 6, for example, a peripheral portion 108 of a pattern 100 of a crystalline silicon film to be obtained is removed. In this region 108, stress distortion and defects, which are formed when the pattern 103 is obtained, are concentrated to its peripheral portion 106. Then, the metal element that promotes the crystallization of silicon is present with high concentration within this region 106. As a consequence, by removing this region 106, it is possible to obtain a crystalline silicon film 100 from which the influence caused by this metal element has been eliminated.

In such a case that a region into which defects and stress are concentrated is formed artificially, a diffusion distance "D" of the metal element will now be considered. Concretely speaking, since another distance "d" defined from a central portion of an eventually obtained pattern to the region into which the defects and the stress are concentrated is selected to be d=D/30 to D, the metal element can be effectively and forcibly moved to such a region into which the above described defects and stress are concentrated. More specifically, the above described metal element can be removed from the channel forming region of the thin-film transistor, so that such a thin-film transistor operable under stable condition can be manufactured.

As described above, since the region into which the defects and stress are concentrated is used as the gettering region of the metal element that promotes the crystallization of silicon, the reliability of the semiconductor device using the crystalline silicon film can be improved.

Embodiment

Embodiment 1

In the following embodiment, the embodiment used nickel as a metal element that promotes the crystallization of silicon is mainly shown. This is because the highest advantages could be achieved when nickel is used. Also, as other preferable metal elements except for nickel, there are palladium, platinum, and copper. When these preferable metal elements are used, a similar effect to that of nickel may be obtained.

The scheme of the manufacturing step of the present embodiment in FIG. 1 is shown. First, a silicon oxide film 102 having a thickness of 3000 Å is formed as an undercoat film on a glass substrate 101 by a plasma CVD method or a sputtering method. This silicon oxide film 102 has such a function to block a diffusion of an impurity from the glass substrate 101. Also, this silicon oxide film 102 has another function to relax the stress produced between the glass substrate 101 and a silicon thin-film which will be formed in a later step.

Next, an amorphous silicon film (not shown) having a thickness of 500 Å is formed on the silicon oxide film by a plasma CVD method. Next, an island-shaped pattern 103 made of an amorphous silicon film is formed by patterning a pattern larger than an active layer of a finally obtained thin-film transistor (FIG. 1(A)).

As for a plasma CVD film having a thickness of 500 Å used in this embodiment, it was found that the maximum diffusion distance of the nickel element is approximately 2 $\mu$m under the condition of 550° C. and 4 hours. As a consequence, a distance "d" shown in FIG. 6 which represents a condition under which the thin-film transistor of FIG. 1 is viewed from the upper surface, is selected to be 2 $\mu$m. It should be noted that a distance indicated by "a" is selected to be 0.5 $\mu$m.

It is desirable to form this pattern by a plasma etching process having vertical anisotropy. This is because when a plasma etching treatment is carried out, the stress distortion and defects caused by the plasma damages would be readily produced in the edge regions of the island-shaped pattern.

Then, a nickel acetate solution whose concentration has been controlled to a predetermined value is coated by a spin coat method in order that the nickel element 104 is held in contact with an exposed surface of the amorphous silicon film 103 (FIG. 1(A)).

Under this condition, the heat treatment at 600° C. is performed for 4 hours. The temperature of this heat treatment is desirably selected to be higher temperatures in the temperature range where the glass substrate can endure the higher temperatures. Accordingly, when a quartz substrate is used, the heating temperature is preferably selected to be from 800° C. to 1100° C. to perform the crystallization.

The pattern 103 of the amorphous silicon film is crystallized by performing this heat treatment. At this time, the nickel element disperses to the peripheral portion of the pattern 103 and concentrates thereto. This tendency that the nickel element concentrates to the peripheral portion of the pattern 103 is emphasized in connection with the temperature increase of the heat treatment.

In accordance with this diffusion of the nickel element, crystallization of the amorphous silicon film is advanced, so that the pattern 103 is converted into a crystalline silicon film 105.

Also, at this time, the nickel element is concentrated to an edge region 106 of the pattern into which the plasma damage and the stress distortion are concentrated (FIG. 1(B)).

Next, an exposed region of 108 is removed by an etching process by using a resist mask 107. In other words, the region into which the nickel element is concentrated is removed by an etching process. An active layer 100 of a thin film transistor is accomplished by this etching step (FIG. 1(C)).

In the region of 108 to be removed as shown in FIG. 6, dimension indicated as "a" is selected to be 20 $\mu$m. In this embodiment, dimension indicated by "d" is selected to be 20 $\mu$m, and then a rectangular pattern 100 defined by 15 $\mu$m×30 $\mu$m is obtained as indicated in this drawing. This pattern 100 becomes an active layer for constituting the thin film transistor.

In the structure of this embodiment, since the region 106 into which the nickel element has been concentrated is present in the region 108 to be removed, such a condition can be eventually realized under which substantially no lump of the nickel element is present in the active layer indicated by 100.

Furthermore, an aluminum film containing scandium at 0.2 wt % is formed by a sputtering method or an electron beam vapor deposition method. The reason why scandium is contained in the aluminum film is to suppress an occurrence of "hillock" (prickle-shaped projection, or needle-shaped projection) caused by the unusual growth of aluminum in the succeeding step.

Then, this aluminum film is patterned to thereby form a gate electrode 111. Next, the anodic oxidation is carried out in the electrolytic solution by using the gate electrode 111 as the anode, so that an anodic oxide film 112 is formed. A thickness of this anodic oxide film 112 is selected to be 500 Å. This anodic oxide film 112 can provide such a great advantage that the occurrence of "hillock" is suppressed. Also, when the thickness of this anodic oxide film 112 is made thick, an offset gate region may be formed in a succeeding step to implant an impurity ion (FIG. 1(D)).

When the condition of FIG. 1(D) is obtained, a P (phosphorus) ion is implanted by a plasma doping method. In this manufacturing step, the gate electrode 108 may constitute the mask, so that a source region 113, a channel forming region 114, and a drain region 115 are formed in the self-alignment manner (FIG. 1(D)).

In this example, the N-channel type thin-film transistor is manufactured by an implantation of P ion. However, when B ion is implanted, a P-channel type thin-film transistor may be alternatively manufactured.

Next, a silicon oxide film 116 is formed as an interlayer insulating film with a thickness of 7000 Å by a plasma CVD method. Furthermore, a contact hole is formed, and both a source electrode 117 and a drain electrode 118 are formed by using a laminating film of a titanium film, an aluminum film, and a titanium film. In this manner, a thin-film transistor as shown in FIG. 1(E) may be accomplished.

When the manufacturing steps of this embodiment 1 are used, it is possible to suppress such a fact that the region to which the nickel element is concentrated is formed in the active layer 100. As a consequence, the difficulties caused by the presence of the nickel element can be suppressed.

Embodiment 2

This embodiment is related to an arrangement for obtaining a higher crystallinity by combining the manufacturing steps shown in the embodiment 1 with irradiation of laser light. Also, in the present embodiment, a quartz substrate is used.

FIG. 4 shows a manufacturing step according to this embodiment 2. Similar to the manufacturing steps indicated in FIG. 1, a silicon oxide film 102 is formed as an undercoat film on a quartz substrate 401. In this embodiment, the silicon oxide film 102 having a thickness of 5000 Å is formed in order to relax stress executed between the quart substrate and a silicon film which will be formed later.

Next, an amorphous silicon film having a thickness of 1000 Å is formed by a low pressure thermal CVD method. Subsequently, this amorphous silicon film is patterned to thereby form an island-like pattern 103 (FIG. 4(A)).

Then, a nickel acetate solution is coated by a spin coat method, and as indicated by reference numeral 104, the nickel element is held in contact with the surface of the island-like pattern 103 made of the amorphous silicon film in a film shape (FIG. 4(A)).

Thereafter, the heat treatment is carried out at 850° C. for 4 hours, so that the island-like pattern 103 made of an amorphous silicon film is converted into a crystalline silicon film. In this step, since the heating temperature is high, the nickel element is more highly concentrated into the peripheral portion of the pattern in comparison with the embodiment 1 (FIG. 4(B)).

As a result, a crystalline silicon film 105 and also a region 106 where the nickel element is concentrated can be obtained. Then, the peripheral portion 106 of the pattern is removed by an etching process using the resist mask 107. At this step, such a region where the nickel element is present in the concentrated manner is selectively removed (FIG. 4(C)).

Then, by removing the resist mask 107, a crystalline silicon film 402 having an island-like pattern for constituting an active layer of a thin-film transistor is obtained. The region indicated by reference numeral 402 corresponds to a region indicated by reference numeral 109 of FIG. 4(B).

Subsequently, as represented in FIG. 4(D), laser light is irradiated. The crystallinity of the crystalline silicon film 402 having the island-like pattern can be improved by laser irradiation.

Also, in accordance with this embodiment 2, after the laser light irradiation, the heat treatment is carried out at 800° C. for 2 hours. By this heat treatment, the defects in the film which occurred by the laser light irradiation can be reduced (FIG. 4(E)).

Even if this second heat treatment is not carried out, such a crystalline silicon film having sufficiently high crystallinity can be obtained. Accordingly, if the overall manufacturing process is preferred to simplify, this heating step may be omitted.

After the active layer 402 made of the crystalline silicon film has been obtained in this manner, a thin-film transistor using the active layer 402 is fabricated in accordance with the steps shown in FIG. 1.

Embodiment 3

This embodiment 3 relates to such an arrangement that a heat treatment is carried out instead of the laser light irradiation in the manufacturing steps shown in FIG. 4. FIG. 5 shows manufacturing steps of this embodiment. First, a silicon oxide film 102 having a thickness of 5000 Å is formed as a base film on a quartz substrate 401 by a plasma CVD method. Next, an amorphous silicon film (not shown) having a thickness of 1000 Å is formed by a low pressure thermal CVD method.

Next, this amorphous silicon film is patterned to thereby form an island-like pattern 103 as indicated in FIG. 5(A). Furthermore, a nickel acetate solution is coated by a spin coat method, and a nickel element is provided in a film shape as indicated by reference numeral 104 (FIG. 5(A)).

Then, a heat treatment is performed at 850° C. for 4 hours, so that a crystalline silicon film 109 is obtained. Under this state, the nickel element is concentrated around this crystalline silicon film 109 (FIG. 5(B)).

Next, a resist mask 107 is arranged to conduct an etching in order to remove a region 108 in FIG. 5(C). In this case, the region 109 is slightly etched for a small margin.

As described above, the island-like pattern 402 made of the crystalline silicon film is obtained, as illustrated in FIG. 5(D). It should be noted that this pattern 110 will constitute an active layer of a thin-film transistor in a later step.

According to this embodiment, the heat treatment is again carried out under such a state as shown in FIG. 5. The crystallinity of the island-like pattern 110 can be furthermore improved by performing this second heat treatment. It should be noted that laser light or intense light may be irradiated after this heat treatment is performed.

Embodiment 4

This embodiment 4 is featured as follows. Openings are formed in an amorphous silicon film in the vicinity of a region 701 to be an active layer of a thin-film transistor. A metal element that promotes the crystallization of silicon is segregated in the region where the openings are formed.

To execute this embodiment, an amorphous silicon film 700 is formed on a substrate having a proper insulating surface by a plasma CVD method, or a low pressure thermal CVD method. Next, a portion of the amorphous silicon film is performed by etching treatment, as represented by reference numeral 702, so as to form openings. It should be understood that the shape of the openings may not be limited to a rectangular shape, but may be a circular shape or a slit shape.

In this embodiment, nickel is used as the metal element that promotes the crystallization of silicon. After the above-described openings have been formed, a nickel acetate solution whose concentration is controlled to a predetermined value is coated, and the nickel element is held in contact with the amorphous silicon film 700 in film shape.

Then, the heat treatment is carried out, so that the amorphous silicon film 700 is crystallized. At this time, nickel element is concentrated to opening portions indicated by 702. This is because that defects and stress distortion are concentrated to the region of the openings 702.

The structure as illustrated in this embodiment may become effective in the case that a diffusion distance of a metal element is long, and further a dimension of a pattern is small. For example, this structure becomes effective when a very fine integrated circuit is constituted by using a quartz substrate.

In FIG. 7, it is necessary that a distance indicated as "c" should satisfy the following condition:

$c = D/30$ to $D$ $D = D_0 \, t \, \exp(\Delta E/kt)$ Generally speaking, the diffusion distance of the metal element indicated by "D" may be actually measured for the sake of simplicity.

In this condition, symbol "D" is a maximum diffusion distance, whereas a minimum diffusion distance is substantially one out of several tens of this maximum diffusion distance. If the distance indicated by the above symbol "c" is made shorter than this minimum diffusion distance, it is possible to form a constitution from which the nickel element is completely removed. Concretely speaking, when the value of "c" is selected to be 5 μm or shorter, the nickel concentration can be made very low. The above-explained value of "D" may become greatly different from each other, depending upon the film forming conditions of the starting films, the film forming methods thereof, and further the heating methods thereof. Generally, the value of "D" is 1 μm to 5 μm. As a result, the value of "d" is selected to be 2 μm or smaller, preferably 1 μm or smaller.

Embodiment 5

FIG. 8 schematically shows manufacturing steps according to an embodiment 5. In this manufacturing step shown in FIG. 8, a quartz substrate is used as a substrate. A silicon oxide film 802 having a thickness of 5000 Å is firstly fabricated as a base film on the quartz substrate 801 by a plasma CVD method. Next, an amorphous silicon film (not shown) having a thickness of 7000 Å is formed. Then, this amorphous silicon film is patterned to thereby form a pattern as indicated by 803 of FIG. 8(A).

Subsequently, a nickel acetate solution whose concentration is controlled to a preselected value is coated, and then a nickel element is formed in a film shape as indicated by reference numeral 803 (see FIG. 8A).

Next, the heat treatment is performed at 950° C. for 4 hours so as to obtain a crystalline silicon film 804 (FIG. 8(B)).

Thereafter, a surface of a crystalline silicon film having an island-shape indicated by reference numeral 805 is etched by using the isotropic etching means. In this step, a crystalline silicon film 806 having a thickness of 1500 Å is obtained (FIG. 8(C)).

Subsequently, the thermal oxidation is carried out at 950° C., so that a thermal oxidation film having a thickness of 500 Å is formed on an exposed surface of the island-like crystalline silicon film 806. In this manner, an active layer 806 made of the crystalline silicon film is obtained which can be utilized in a thin-film transistor (FIG. 8(D)).

Embodiment 6

This embodiment 6 is related to such a structure capable of further emphasizing the eliminating effect of the metal element that promotes the crystallization of silicon. In FIG. 9, there are shown manufacturing steps according to this embodiment. First, a silicon oxide film 902 having a thickness of 3000 Å is formed as a base film on a glass substrate 901.

Next, an amorphous silicon film having a thickness of 500 Å is formed by a plasma CVD method. Furthermore, this amorphous silicon film is patterned to thereby form an island-like region indicated by reference numeral 903. Then, a nickel acetate solution whose concentration is controlled to a predetermined value is coated by a spin coat method, and a nickel element is provided in a film shape as indicated by reference numeral 904 (FIG. 9(A)).

Subsequently, a resist mask 905 is positioned so as to implant a P (phosphorous) ion. In this step, the P ion is implanted into a region indicated by 906. By performing implantation of the P ion, defects are formed in the region indicated by 906 in higher density. Also, no P ion is implanted into another region denoted by 907 (FIG. 9(B)).

Next, the resist mask 905 is removed, and the heat treatment is performed at 550° C. for 4 hours. In this step, the whole amorphous silicon film is crystallized. At this time, the nickel element is concentrated to a region indicated by 906 which is located at an edge peripheral portion of the pattern indicated by 903. This effect is caused by such a fact that it is at the edge of the pattern, P (phosphorous) having the gettering effect of the metal element is implanted into the region 906, and further, the defects are formed in the region 906 at higher density by implantation of P ion.

Thereafter, as indicated in FIG. 9(C), another resist mask 908 is newly arranged in order to etch the exposed region of the silicon film. Thus, it is possible to obtain a region 909 made of the island-like crystalline silicon film from which the nickel element has been removed. Although the phosphorous ion is used in the above-described manufacturing step, an oxygen ion may be used (FIG. 9(D)).

EFFECT OF THE PRESENT INVENTION

The pattern of amorphous silicon film, which is previously performed by patterning, is crystallized by heat treatment using the metal element that promotes the crystallization of silicon. Furthermore, the peripheral portion of the pattern where said metal element is concentrated is removed, thereby the pattern having small portion or no portion into which the metal element has been concentrated can be obtained.

In other words, as to the technique for obtaining the crystalline silicon film by using the metal element that promotes the crystallization of silicon, such a technique is proposed, which can avoid that the metal element is locally concentrated.

As a consequence, the characteristics of thin-film transistors can be improved by utilizing the invention disclosed in this specification. Also, the manufacturing yield of the obtained thin-film transistor can be improved. Moreover, the characteristics of the obtained thin-film transistor can be made stable.

BRIEF DESCRIPTION OF DRAWINGS

For a better understanding of the present invention, reference is made of the following detailed description to be read in conjunction with the accompanying drawings, in which.

Figure 1A:
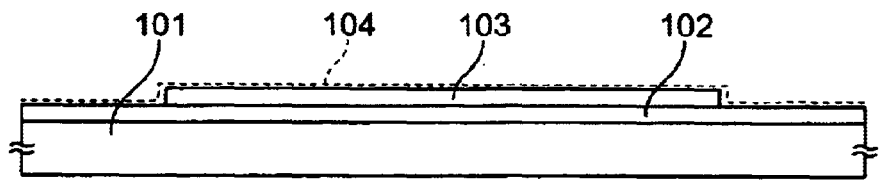
FIGS. 1A–1E schematically show a manufacturing process of a thin-film transistor according to an embodiment of the present invention.
Figure 1B:
Figure 1C:
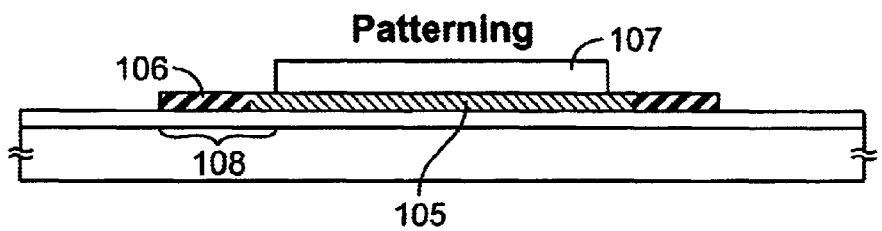
Figure 1D:
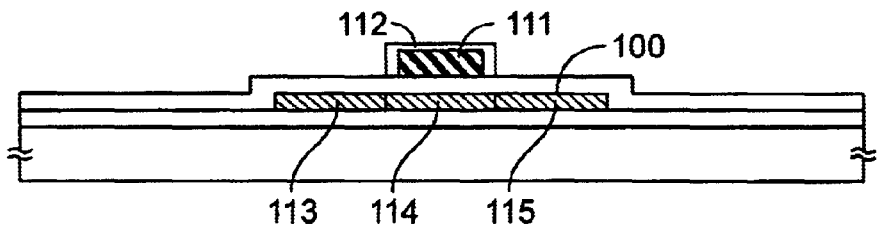
Figure 1E:
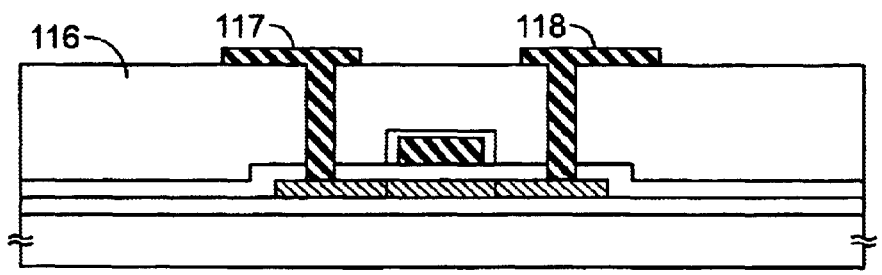
Figure 2A:
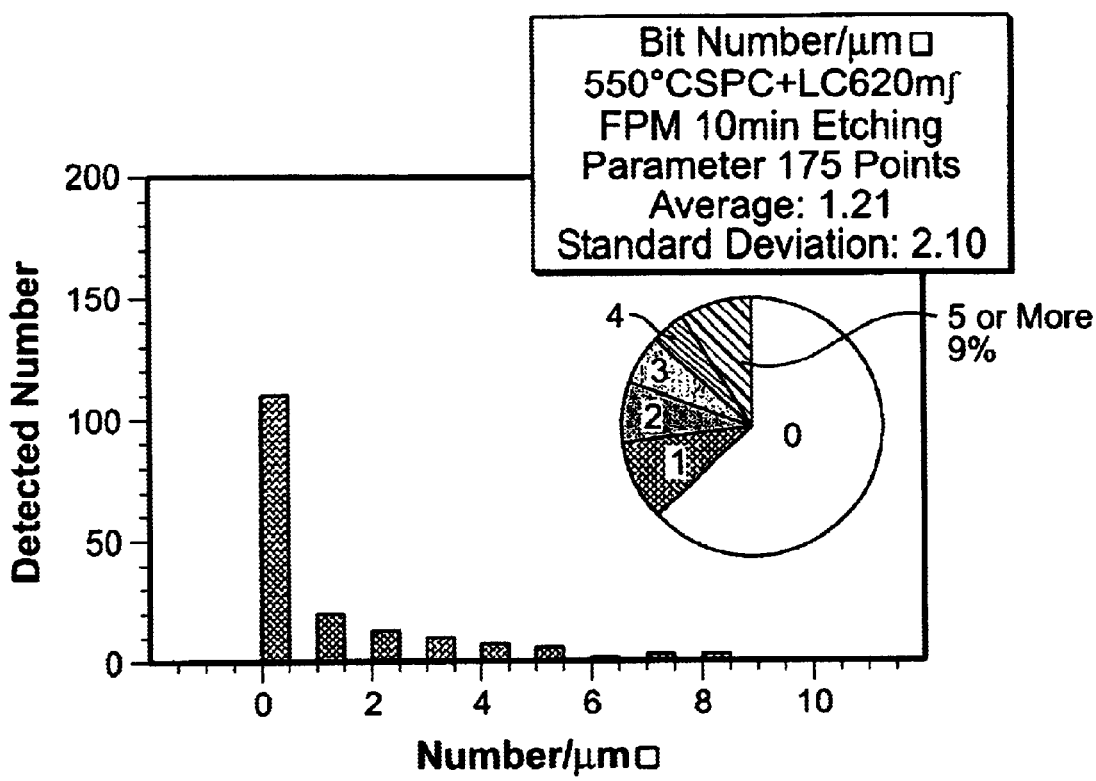
FIG. 2 graphically represents the number of lumps of nickel element contained in a crystalline silicon film per unit area.
Figure 2B:
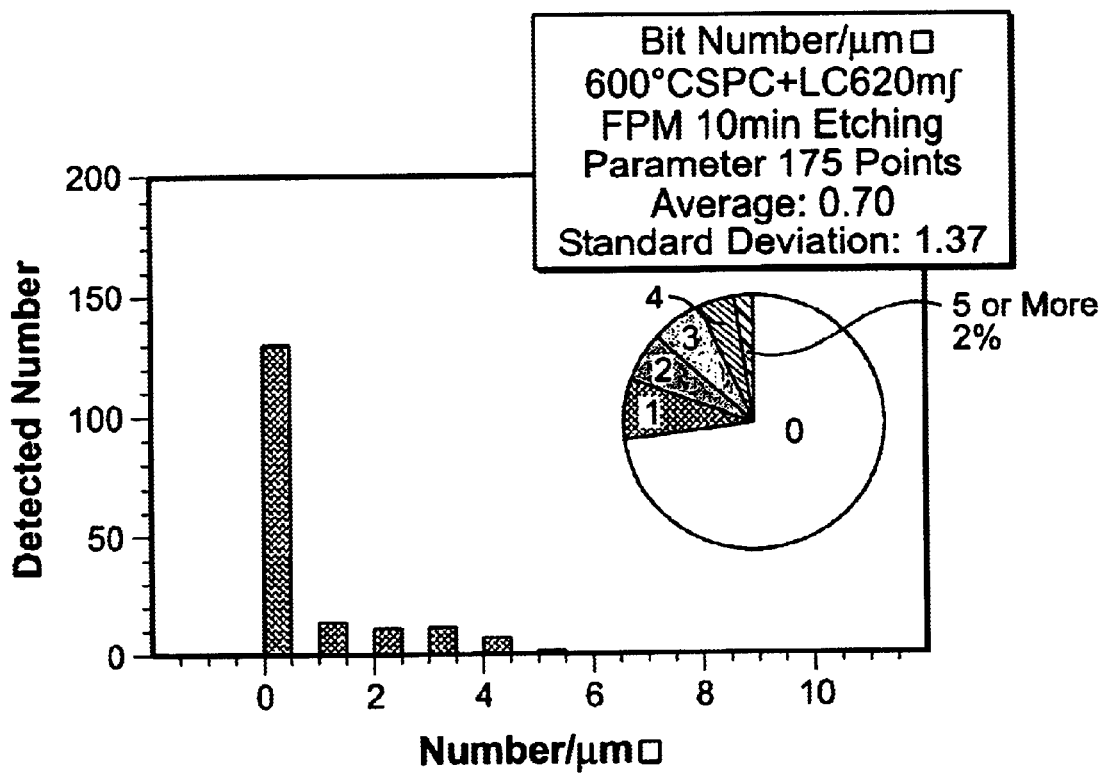
Figure 2C:
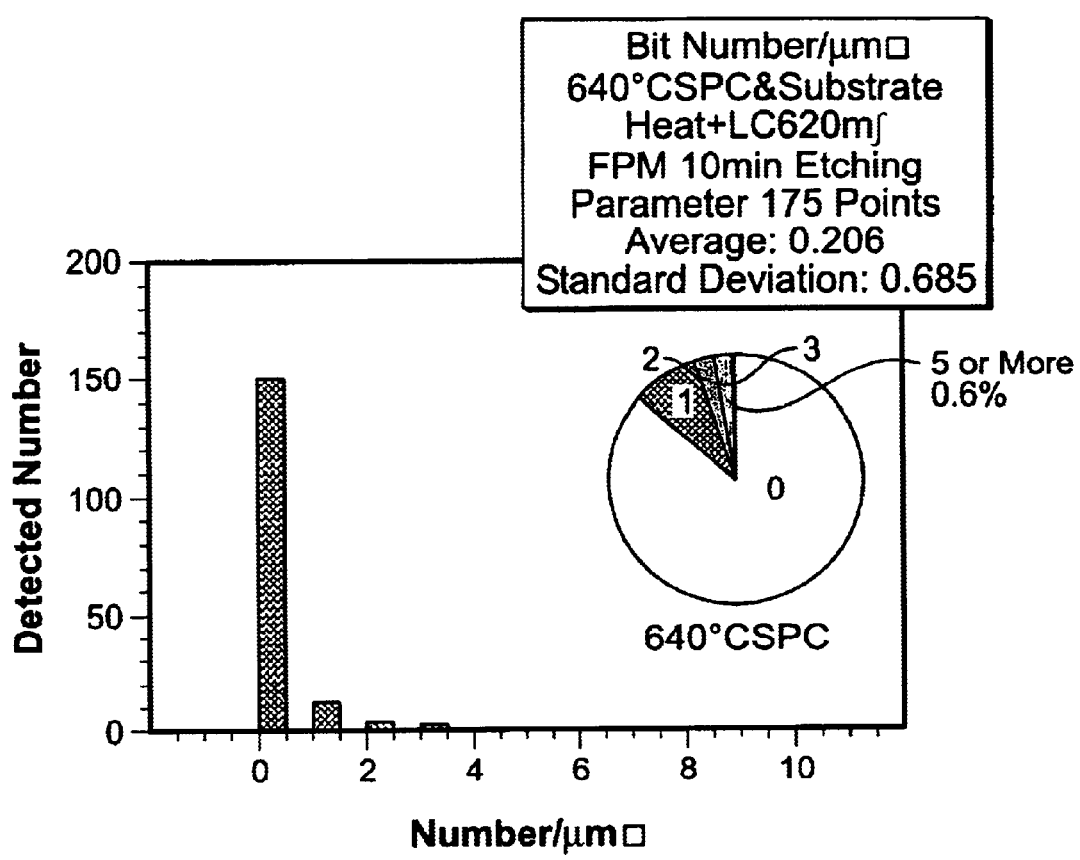
Figure 3:
FIG. 3 is a photograph for showing the crystalline silicon film.
Figure 3:
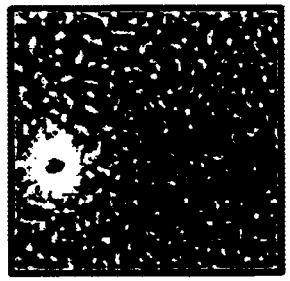
Figure 3:
Figure 3:
Figure 3:
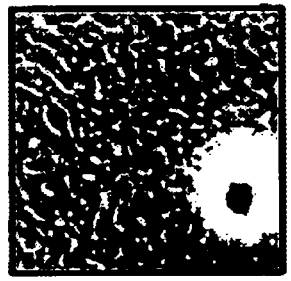
Figure 3:
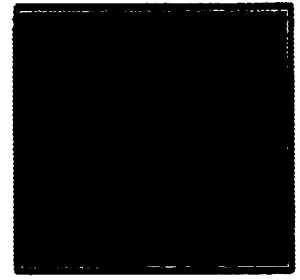
Figure 3:
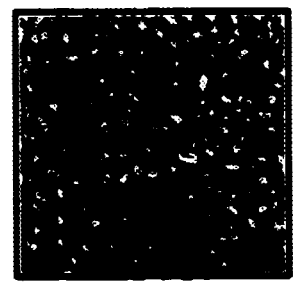
Figure 3:
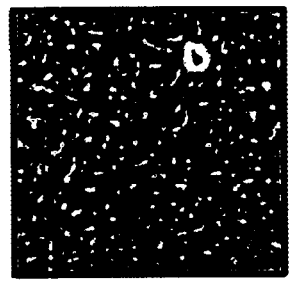
Figure 3:
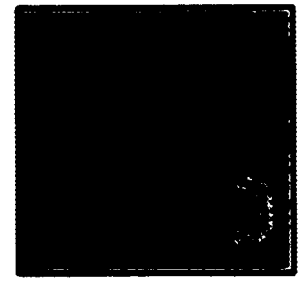
Figure 4A:
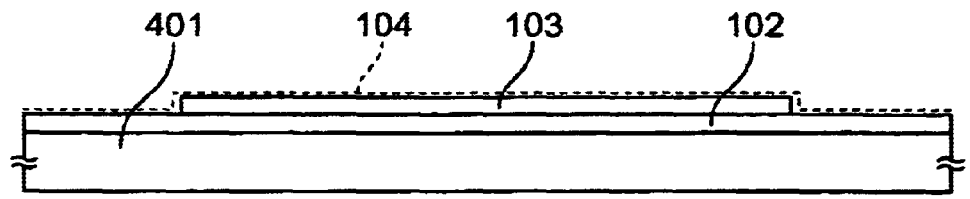
FIGS. 4A–4E schematically indicate a manufacturing step of a thin-film transistor according to another embodiment of the present invention.
Figure 4B:
Figure 4C:
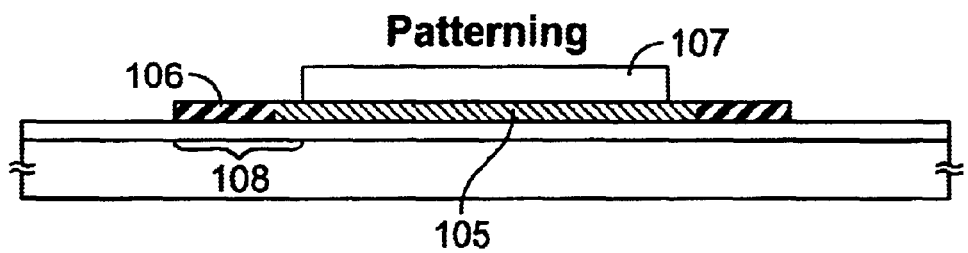
Figure 4D:
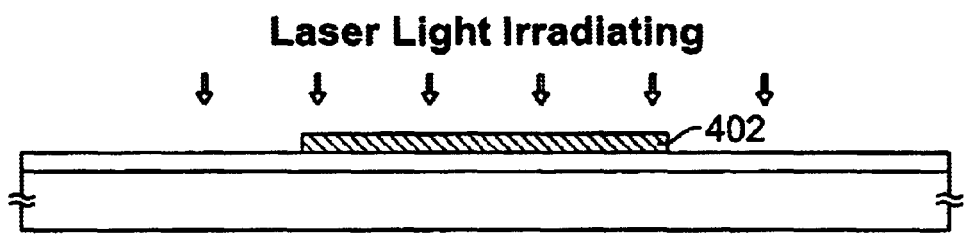
Figure 4E:
Figure 5A:
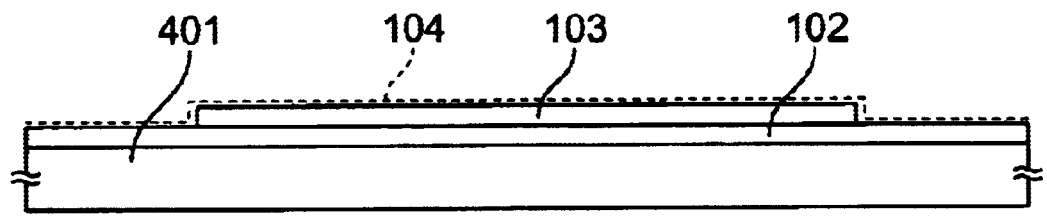
FIGS. 5A–5D schematically indicates a manufacturing step of a thin-film transistor according to another embodiment of the present invention.
Figure 5B:
Figure 5C:
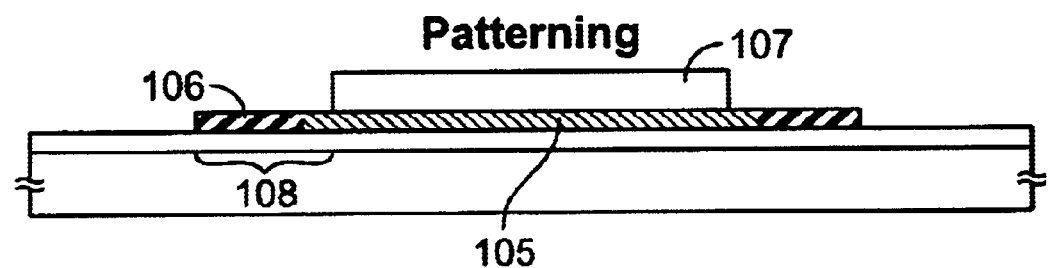
Figure 5D:
Figure 6:
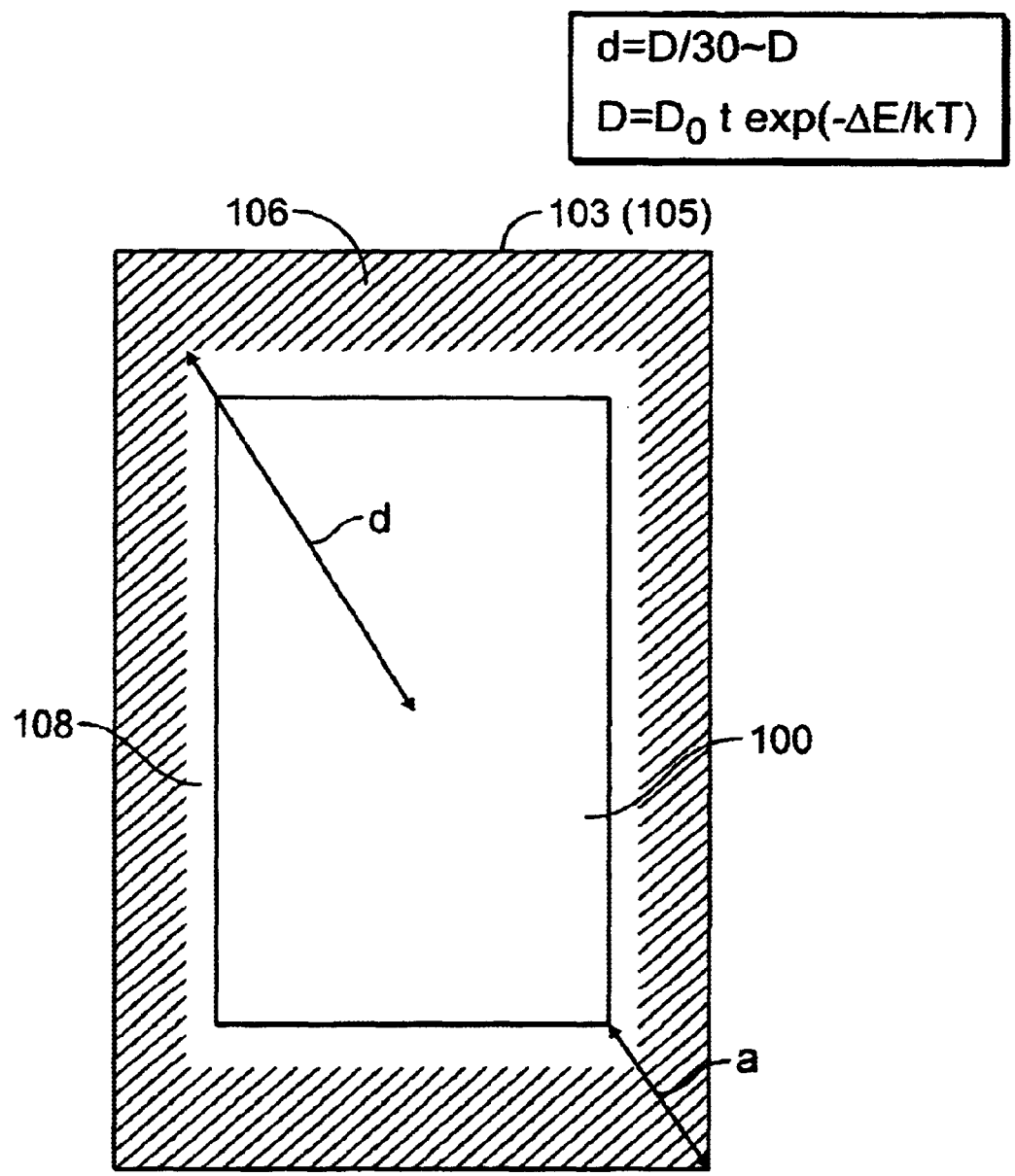
FIG. 6 is a top view for representing a patterning condition of the crystalline silicon film.
Figure 7:
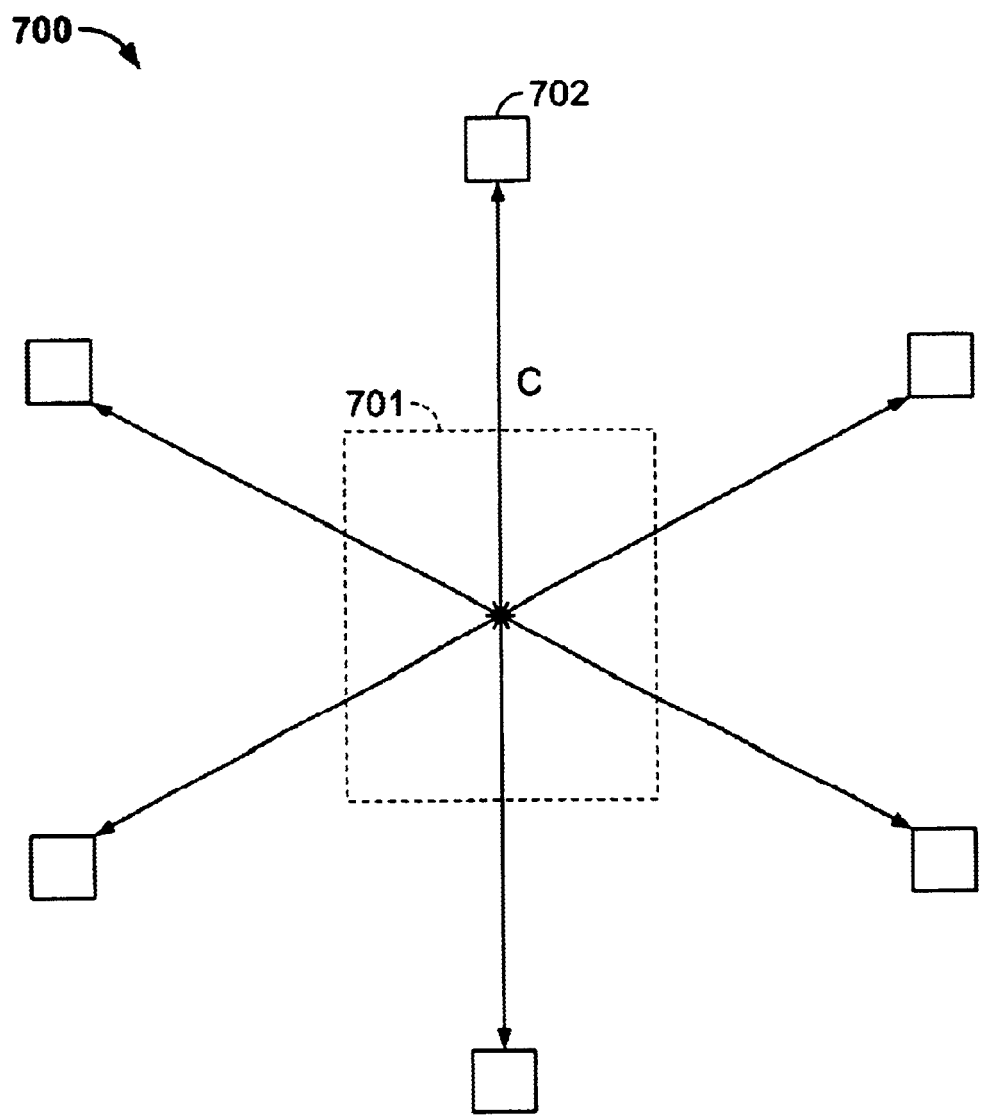
FIG. 7 is a top view for indicating a patterning condition of a crystalline silicon film manufactured by the present invention.
Figure 8A:
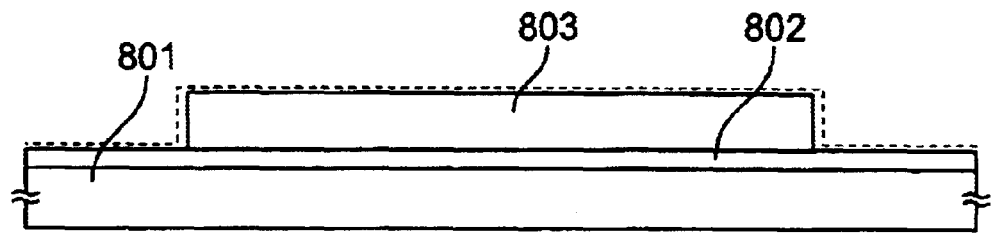
FIGS. 8A–8D schematically indicate a manufacturing step of a thin-film transistor according to a further embodiment of the present invention.
Figure 8B:
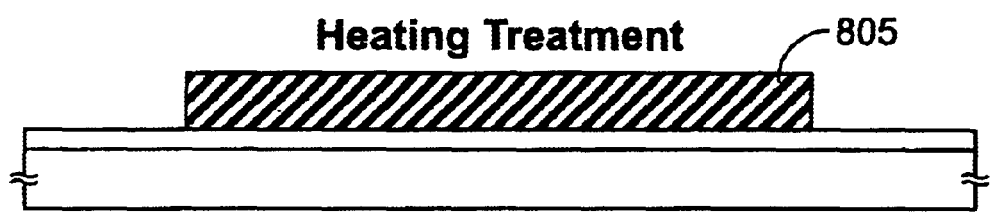
Figure 8C:
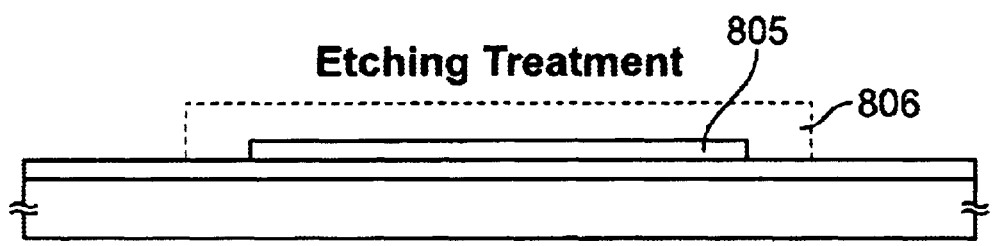
Figure 8D:
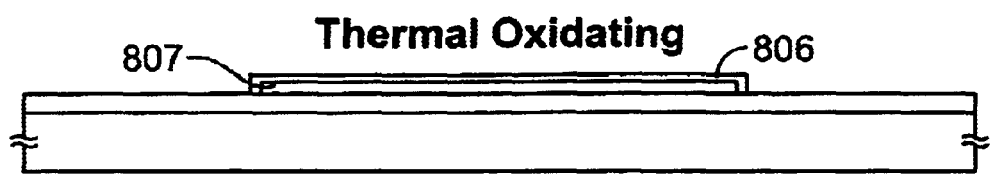
Figure 9A:
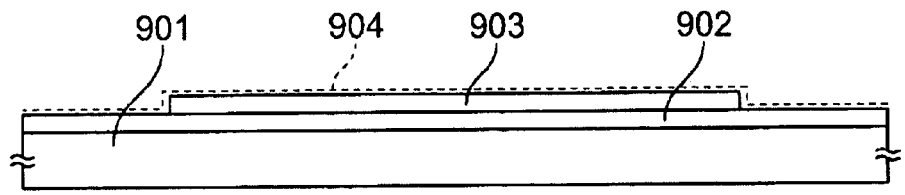
FIGS. 9A–9D schematically indicate a manufacturing step of a thin-film transistor according to a still further embodiment of the present invention.
Figure 9B:
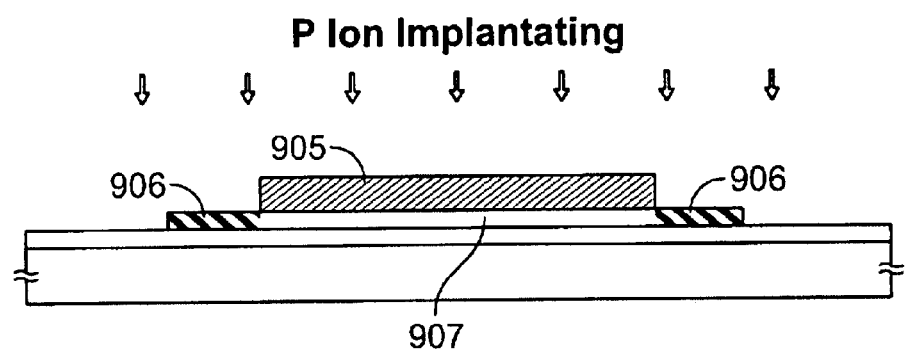
Figure 9C:
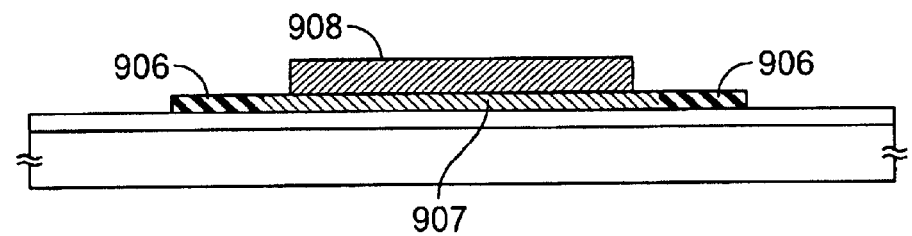
Figure 9D:
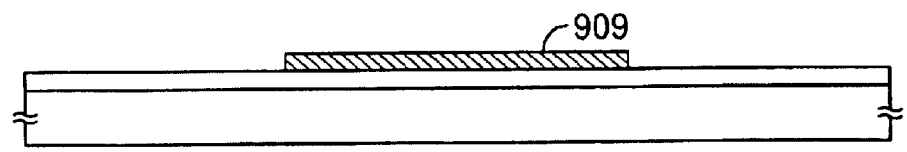

DESCRIPTION OF MARKS 101 glass substrate
102 base film (silicon oxide film)
103 pattern of amorphous silicon film patterned in an island-shape
104 nickel element formed in a film shape
105 pattern of crystalline silicon film in island-shape
106 region in which nickel element is segregated
107 resist mask
108 region removed by etching
100 active layer made of crystalline silicon film
110 gate insulating film(silicon oxide film)
111 gate electrode
112 anodic oxidation film
113 source region
114 channel forming region
115 drain region
116 interlayer insulating film (silicon oxide film)
117 source region
118 drain region
401 quartz substrate
402 active layer made of crystalline silicon film
700 amorphous silicon film
701 region to be an active layer
702 openings formed in amorphous silicon film
801 quartz substrate
802 silicon oxide film
803 amorphous silicon film
804 nickel element formed in a film shape
805 crystalline silicon film
806 region performed by etching
807 active layer
808 gate insulating film

What is claimed is:

1. A method for manufacturing a semiconductor device comprising the steps of:
   forming a non-single crystalline semiconductor film on an insulating surface;
   introducing ions of an element which is inert with respect to said semiconductor film into a selected portion of said semiconductor film using a first mask covering a first portion of said semiconductor film provided over said semiconductor film;
   disposing a crystallization promoting material in contact with said semiconductor film;
   crystallizing said semiconductor film by heating wherein said crystallization promoting material segregates in said selected region during the crystallization;
   forming a second mask over said semiconductor film; and
   etching a part of said first portion of said semiconductor film and said selected portion of said semiconductor film using said second mask after said heating to form an active layer of said semiconductor device.

2. A method according to claim 1, wherein a width of said second mask is smaller than that of said first mask in a longer direction of said semiconductor film.

3. A method for manufacturing a semiconductor device comprising the steps of:
   forming a non-single crystalline semiconductor film on an insulating surface provided over a quartz substrate;
   introducing ions of an element which is inert with respect to said semiconductor film into a selected portion of said semiconductor substrate using a first mask covering a first portion of said semiconductor film provided over said semiconductor film;
   disposing a crystallization promoting material in contact with said semiconductor film;
   crystallizing said semiconductor film by heating at a temperature of 800 to 1100° C. wherein said crystallization promoting material segregates in said selected region during the crystallizing;
   forming a second mask over said semiconductor film; and
   etching a part of said first portion of said semiconductor film and said selected portion of said semiconductor film using said second mask after said heating to form an active layer of said semiconductor device.

4. A method according to claim 3, wherein a width of said second mask is smaller than that of said first mask in a longer direction of said semiconductor film.

5. A method for manufacturing a semiconductor device comprising:
   providing a semiconductor film with a crystallization promoting material;
   introducing phosphorus into a selected portion of said semiconductor film using a first mask covering a first portion of said semiconductor film provided over said semiconductor film;
   crystallizing said semiconductor film with said selected region of said semiconductor film containing said phosphorus to getter said crystallization promoting material during said crystallizing;
   forming a second mask over said semiconductor film; and
   etching a part of said first portion of said semiconductor film and said selected portion of said semiconductor film using said second mask after said heating to form an active layer of said semiconductor device.

6. The method of claim 5 wherein said gettering of said crystallization promoting material is caused by a gettering effect of said phosphorus.

7. The method of claim 5 wherein said semiconductor film comprises silicon.

8. The method of claim 5 wherein said crystallization promoting material comprises an element selected from the group consisting of Fe, Co, Ni, Ru, Rh, Pd, Os, Ir, Pt, Cu and Au.

9. A method according to claim 5, wherein a width of said second mask is smaller than that of said first mask in a longer direction of said semiconductor film.

10. A method for manufacturing a semiconductor device comprising:
    providing a semiconductor film with a crystallization promoting material;
    introducing phosphorus into a selected portion of said semiconductor film using a first mask covering a first portion of said semiconductor film provided over said semiconductor film;
    crystallizing said semiconductor film by heating with said selected region of said semiconductor film containing said phosphorus to getter said crystallization promoting material during said crystallizing;
    forming a second mask over said semiconductor film; and
    etching a part of said first portion of said semiconductor film and said selected portion of said semiconductor film using said second mask after said heating to form an active layer of said semiconductor device.

11. The method of claim 10 wherein said gettering of said crystallization promoting material is caused by a gettering effect of said phosphorus.

12. The method of claim 10 wherein said semiconductor film comprises silicon.

13. The method of claim 10 wherein said crystallization promoting material comprises an element selected from the group consisting of Fe, Co, Ni, Ru, Rh, Pd, Os, Ir, Pt, Cu and Au.

14. A method according to claim 10, wherein a width of said second mask is smaller than that of said first mask in a longer direction of said semiconductor film.

15. A method for manufacturing a semiconductor device comprising:
   providing a semiconductor film with a crystallization promoting material;
   introducing phosphorus into a selected portion of said semiconductor film using a first mask covering a first portion of said semiconductor film provided over said semiconductor film;
   crystallizing said semiconductor film with said selected region of said semiconductor film containing said phosphorus to getter said crystallization promoting material during said crystallizing;
   forming a second mask over said semiconductor film; and
   etching a part of said first portion of said semiconductor film and said selected portion of said semiconductor film using said second mask after said heating to form an active layer of said semiconductor device.

16. The method of claim 15 wherein said gettering of said crystallization promoting material is caused by a gettering effect of said phosphorus.

17. The method of claim 15 wherein said semiconductor film comprises silicon.

18. The method of claim 15 wherein said crystallization promoting material comprises an element selected from the group consisting of Fe, Co, Ni, Ru, Rh, Pd, Os, Ir, Pt, Cu and Au.

19. A method according to claim 15, wherein a width of said second mask is smaller than that of said first mask in a longer direction of said semiconductor film.

20. A method for manufacturing a semiconductor device comprising:
   forming a semiconductor film comprising silicon over a substrate;
   providing said semiconductor film with a crystallization promoting material;
   introducing an argon ion into a selected portion of said semiconductor film using a first mask covering a first portion of said semiconductor film provided over said semiconductor film;
   heating said semiconductor film to getter said crystallization promoting material into said selected portion of said semiconductor film
   forming a second mask over said semiconductor film; and
   etching a part of said first portion of said semiconductor film and said selected portion of said semiconductor film using said second mask after said heating to form an active layer of said semiconductor device.

21. The method of claim 20 wherein said crystallization promoting material comprises an element selected from the group consisting of Fe, Co, Ni, Ru, Rh, Pd, Os, Ir, Pt, Cu and Au.

22. The method of claim 20 further comprising the step of etching said selected portion of said semiconductor film.

23. The method of claim 20 wherein said semiconductor film comprises an amorphous silicon.

24. The method of claim 20 wherein said heating is conducted at a temperature of 450 to 700° C.

25. The method of claim 20 wherein said heating is conducted at a temperature of 800 to 1100° C.

26. A method according to claim 20, wherein a width of said second mask is smaller than that of said first mask in a longer direction of said semiconductor film.

27. A method for manufacturing a semiconductor device comprising:
   forming a semiconductor film comprising silicon over a substrate;
   providing said semiconductor film with a crystallization promoting material;
   introducing an argon ion into a selected portion of said semiconductor film using a first mask covering a first portion of said semiconductor film provided over said semiconductor film;
   heating said semiconductor film to crystallize said semiconductor film using said crystallization promoting material and to getter said crystallization promoting material into said selected portion of said semiconductor film
   forming a second mask over said semiconductor film; and
   etching a part of said first portion of said semiconductor film and said selected portion of said semiconductor film using said second mask after said heating to form an active layer of said semiconductor device.

28. The method of claim 27 wherein said crystallization promoting material comprises an element selected from the group consisting of Fe, Co, Ni, Ru, Rh, Pd, Os, Ir, Pt, Cu and Au.

29. The method of claim 27 further comprising the step of etching said selected portion of said semiconductor film.

30. The method of claim 27 wherein said semiconductor film comprises an amorphous silicon.

31. The method of claim 27 wherein said heating is conducted at a temperature of 450 to 700° C.

32. The method of claim 27 wherein said heating is conducted at a temperature of 800 to 1100° C.

33. A method according to claim 27, wherein a width of said second mask is smaller than that of said first mask in a longer direction of said semiconductor film.

34. A method for manufacturing a semiconductor device comprising:
   forming a semiconductor island comprising silicon over a substrate;
   providing said semiconductor island with a crystallization promoting material;
   introducing an argon ion into a selected portion of said semiconductor island;
   heating said semiconductor island to getter said crystallization promoting material into said selected portion of said semiconductor island
   removing said selected portion of said semiconductor island and a part of said semiconductor island adjacent to said selected portion in order to form an active layer of said semiconductor device.

35. The method of claim 34 wherein said crystallization promoting material comprises an element selected from the group consisting of Fe, Co, Ni, Ru, Rh, Pd, Os, Ir, Pt, Cu and Au.

36. The method of claim 34 further comprising the step of etching said selected portion of said semiconductor island.

37. The method of claim 34 wherein said semiconductor island comprises an amorphous silicon.

38. The method of claim 34 wherein said heating is conducted at a temperature of 450 to 700° C.

39. The method of claim 34 wherein said heating is conducted at a temperature of 800 to 1100° C.

40. A method for manufacturing a semiconductor device comprising:
   forming a semiconductor island comprising silicon over a substrate;
   providing said semiconductor island with a crystallization promoting material;
   introducing an argon ion into a selected portion of said semiconductor island;
   heating said semiconductor island to crystallize said semiconductor island using said crystallization promoting material and to getter said crystallization promoting material into said selected portion of said semiconductor island
   removing said selected portion of said semiconductor island and a part of said semiconductor island adjacent to said selected portion in order to form an active layer of said semiconductor device.

41. The method of claim 39 wherein said crystallization promoting material comprises an element selected from the group consisting of Fe, Co, Ni, Ru, Rh, Pd, Os, Ir, Pt, Cu and Au.

42. The method of claim 40 further comprising the step of etching said selected portion of said semiconductor island.

43. The method of claim 40 wherein said semiconductor island comprises an amorphous silicon.

44. The method of claim 40 wherein said heating is conducted at a temperature of 450 to 700° C.

45. The method of claim 40 wherein said heating is conducted at a temperature of 800 to 1100° C.

46. A method for manufacturing a semiconductor device comprising:
   forming a semiconductor film comprising silicon over a substrate;
   providing said semiconductor film with a crystallization promoting material;
   introducing an argon ion into a selected portion of said semiconductor film using a mask provided over said semiconductor film;
   heating said semiconductor film to getter said crystallization promoting material into said selected portion of said semiconductor film; and
   etching said selected portion of said semiconductor film and a part of said semiconductor film covered with said mask in said introducing step after said heating to form an active layer of the semiconductor device,
   wherein said part of said semiconductor film covered with said mask in said introducing step is adjacent to said selected portion.

47. The method of claim 46 wherein said crystallization promoting material comprises an element selected from the group consisting of Fe, Co, Ni, Ru, Rh, Pd, Os, Ir, Pt, Cu and Au.

48. The method of claim 46 wherein said semiconductor film is formed into a semiconductor island.

49. The method of claim 46 wherein said semiconductor film comprises an amorphous silicon.

50. The method of claim 46 wherein said heating is conducted at a temperature of 450 to 700° C.

51. The method of claim 46 wherein said heating is conducted at a temperature of 800 to 1100° C.

52. A method for manufacturing a semiconductor device comprising:
   forming a semiconductor film comprising silicon over a substrate;
   providing said semiconductor film with a crystallization promoting material;
   introducing an argon ion into a selected portion of said semiconductor film using a mask provided over said semiconductor film;
   heating said semiconductor film to crystallize said semiconductor film using said crystallization promoting material and to getter said crystallization promoting material into said selected portion of said semiconductor film; and
   etching said selected portion of said semiconductor film and a part of said semiconductor film covered with said mask in said introducing step after said heating to form an active layer of the semiconductor device,
   wherein said part of said semiconductor film covered with said mask in said introducing step is adjacent to said selected portion.

53. The method of claim 52 wherein said crystallization promoting material comprises an element selected from the group consisting of Fe, Co, Ni, Ru, Rh, Pd, Os, Ir, Pt, Cu and Au.

54. The method of claim 52 wherein said semiconductor film is formed into a semiconductor island.

55. The method of claim 52 wherein said semiconductor film comprises an amorphous silicon.

56. The method of claim 52 wherein said heating is conducted at a temperature of 450 to 700° C.

57. The method of claim 52 wherein said heating is conducted at a temperature of 800 to 1100° C.

58. A method for manufacturing a semiconductor device comprising:
   forming a semiconductor film comprising silicon over a substrate;
   providing said semiconductor film with a crystallization promoting material;
   introducing an argon ion into a selected portion of said semiconductor film using a first mask covering a first portion of said semiconductor film provided over said semiconductor film;
   heating said semiconductor film to getter said crystallization promoting material into said selected portion of said semiconductor film;
   forming a second mask over said semiconductor film;
   etching a part of said first portion of said semiconductor film and said selected portion of said semiconductor film using said second mask after said heating to form an active layer of the semiconductor device.

59. The method of claim 58 wherein said crystallization promoting material comprises an element selected from the group consisting of Fe, Co, Ni, Ru, Rh, Pd, Os, Ir, Pt, Cu and Au.

60. The method of claim 58 wherein said semiconductor film is formed into a semiconductor island.

61. The method of claim 58 wherein said semiconductor film comprises an amorphous silicon.

62. The method of claim 58 wherein said heating is conducted at a temperature of 450 to 700° C.

63. The method of claim 58 wherein said heating is conducted at a temperature of 800 to 1100° C.

64. A method according to claim 58, wherein a width of said second mask is smaller than that of said first mask in a longer direction of said semiconductor film.

65. A method for manufacturing a semiconductor device comprising:
   forming a semiconductor film comprising silicon over a substrate;

providing said semiconductor film with a crystallization promoting material;

introducing an argon ion into a selected portion of said semiconductor film using a first mask covering a first portion of said semiconductor film provided over said semiconductor film;

heating said semiconductor film to crystallize said semiconductor film using said crystallization promoting material and to getter said crystallization promoting material into said selected portion of said semiconductor film;

forming a second mask over said semiconductor film;

etching a part of said first portion of said semiconductor film and said selected portion of said semiconductor film using said second mask after said heating to form an active layer of the semiconductor device.

66. The method of claim 65 wherein said crystallization promoting material comprises an element selected from the group consisting of Fe, Co, Ni, Ru, Rh, Pd, Os, Ir, Pt, Cu and Au.

67. The method of claim 65 wherein said semiconductor film is formed into a semiconductor island.

68. The method of claim 65 wherein said semiconductor film comprises an amorphous silicon.

69. The method of claim 65 wherein said heating is conducted at a temperature of 450 to 700° C.

70. The method of claim 65 wherein said heating is conducted at a temperature of 800 to 1100° C.

71. A method according to claim 65, wherein a width of said second mask is smaller than that of said first mask in a longer direction of said semiconductor film.

* * * * *